United States Patent
Wang et al.

(10) Patent No.: US 9,336,832 B1
(45) Date of Patent: May 10, 2016

(54) HEAT-ASSISTED ROTATING DISK MAGNETOMETER FOR ULTRA-HIGH ANISOTROPY MAGNETIC MEASUREMENTS

(71) Applicant: Seagate Technology LLC, Cupertino, CA (US)

(72) Inventors: Kangkang Wang, Fremont, CA (US); Xiaobin Zhu, San Ramon, CA (US); Ganping Ju, Pleasanton, CA (US); Kai Chieh Chang, Pleasanton, CA (US); Yingguo Peng, San Ramon, CA (US); Timothy J. Klemmer, Fremont, CA (US); Jan-Ulrich Thiele, Sunnyvale, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/720,250

(22) Filed: May 22, 2015

(51) Int. Cl.
| | |
|---|---|
| *G11B 11/00* | (2006.01) |
| *G11B 27/36* | (2006.01) |
| *G11B 5/024* | (2006.01) |
| *G11B 5/09* | (2006.01) |
| *G11B 5/00* | (2006.01) |

(52) U.S. Cl.
CPC .............. *G11B 27/36* (2013.01); *G11B 5/024* (2013.01); *G11B 5/09* (2013.01); *G11B 2005/0021* (2013.01)

(58) Field of Classification Search
CPC ..................... G11B 20/1217; G11B 11/10595; G11B 11/10513; G11B 11/10515; G11B 11/01528; G11B 11/10584; G11B 11/10593; G11B 11/10502; G11B 11/1054; G11B 11/10506; G11B 11/10539; G11B 11/1051; G11B 5/4866; G11B 2005/0021
USPC ............. 369/13.03, 13.04, 13.24, 13.02, 116, 369/13.07
See application file for complete search history.

(56) References Cited

U.S. PATENT DOCUMENTS

| | | | |
|---|---|---|---|
| 6,477,118 B1* | 11/2002 | Awano .................. | G11B 7/1387 369/13.13 |
| 6,483,299 B1 | 11/2002 | Pressesky et al. | |
| 8,666,692 B2* | 3/2014 | Mizuno ..................... | G11B 5/64 360/59 |
| 8,787,124 B1 | 7/2014 | Chernyshov et al. | |
| 2011/0058458 A1 | 3/2011 | Rasing et al. | |
| 2012/0232831 A1 | 9/2012 | Mizuno et al. | |
| 2013/0093419 A1 | 4/2013 | An et al. | |

* cited by examiner

*Primary Examiner* — Ali Neyzari
(74) *Attorney, Agent, or Firm* — Hollingsworth Davis, LLC

(57) ABSTRACT

An apparatus comprises a spindle to rotate a magnetic recording medium and a magnetic field generator to expose a track of the medium to a DC magnetic field. The magnetic field generator is configured to saturate the track during an erase mode and reverse the DC magnetic field impinging the track during a writing mode. A laser arrangement heats the track during the erase mode and, during the writing mode, heats the track while the track is exposed to the reversed DC magnetic field so as to write a magnetic pattern thereon. A reader reads the magnetic pattern and generates a read signal. A processor is coupled to the reader and configured to measure one or more magnetic properties of the track using the read signal. The apparatus can further comprise a Kerr sensor that generates a Kerr signal using the magnetic pattern.

22 Claims, 8 Drawing Sheets

HEAT-ASSISTED ROTATING DISK MAGNETOMETER FOR ULTRA-HIGH ANISOTROPY MAGNETIC MEASUREMENTS

SUMMARY

Embodiments are directed to an apparatus comprising a spindle configured to rotate a magnetic recording medium and a magnetic field generator configured to expose a track of the medium to a DC magnetic field. The magnetic field generator is configured to saturate the track during an erase mode and reverse the DC magnetic field impinging the track during a writing mode. A laser arrangement is configured to heat the track during the erase mode and, during the writing mode, heat the track while the track is exposed to the reversed DC magnetic field so as to write a magnetic pattern thereon. A reader is configured to read the magnetic pattern and generate a read signal. A processor is coupled to the reader and configured to measure one or more magnetic properties of the track using the read signal. The apparatus can further comprise a Kerr sensor configured to generate a Kerr signal using the magnetic pattern. The one or more magnetic properties can comprise magnetic remanence-thickness product ($M_rt$) and Curie Temperature ($T_c$) distribution.

Various embodiments are directed to a method comprising rotating a magnetic recording medium proximate a magnetic field generator, a laser arrangement, and an inductive reader. The method also comprises DC erasing a track of the medium by concurrently exposing the track to a first DC magnetic field and heating the track with the laser arrangement. The method further comprises writing a magnetic pattern on the track by concurrently heating the track using the laser arrangement and exposing the track to a second DC magnetic field opposite the first DC magnetic field. The method also comprises reading the magnetic pattern, generating a read signal, and measuring one or more magnetic properties of the track using the read signal. The method can further comprise rotating the magnetic recording medium proximate a Kerr sensor, generating a Kerr signal using the magnetic pattern, and measuring one or more magnetic properties of the track using the Kerr signal. The one or more magnetic properties can comprise magnetic remanence-thickness product ($M_rt$) and Curie Temperature ($T_c$) distribution.

Other embodiments are directed to an apparatus comprising an arrangement configured to rotate a magnetic recording medium configured for heat-assisted magnetic recording. The apparatus also comprises means for DC erasing a track of the medium using a first DC magnetic field, and means for writing a magnetic pattern on the track by concurrently heating the track and exposing the track to a second DC magnetic field opposite the first DC magnetic field. The apparatus further comprises a reader configured to read the magnetic pattern and generate a read signal, and means for measuring one or more magnetic properties of the track using the read signal.

The above summary is not intended to describe each disclosed embodiment or every implementation of the present disclosure. The Figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The Figures are not necessarily to scale. Like numbers used in the Figures refer to like components. However, it will be understood that the use of a number to refer to a component in a given Figure is not intended to limit the component in another Figure labeled with the same number.

DETAILED DESCRIPTION

Figure 1:
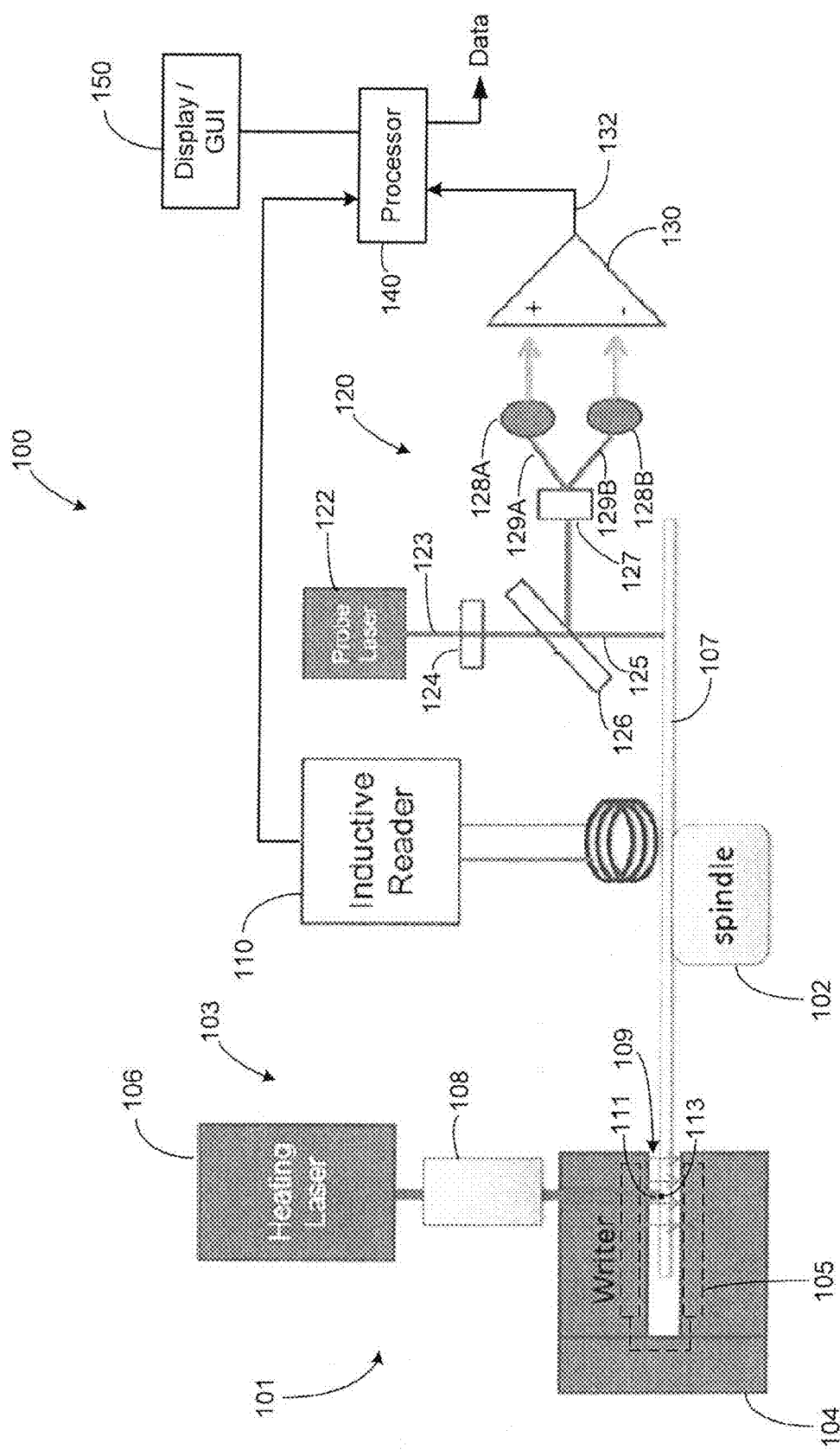
FIG. 1 is a block diagrams of a heat-assisted rotating disk magnetometer (HARDM) apparatus in accordance with embodiments of the disclosure.

In the following description, reference is made to the accompanying set of drawings that form a part of the description hereof and in which are shown by way of illustration several specific embodiments. It is to be understood that other embodiments are contemplated and may be made without departing from the scope of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

Magnetic recording media with extremely high (e.g., ultra-high) anisotropy requires magnetic fields with very high magnetic flux density to characterize various magnetic properties of the media material. To ensure that magnetic recording disks meet certain standards of quality, these magnetic properties need to be tested from time to time, particularly during the manufacturing process. Heat-Assisted Magnetic Recording (HAMR), for example, is a potential recording technology to extend areal density by recording high anisotropy media at elevated temperature. Hence, the Curie Temperature (Tc) distribution is very important for media recording performance. At the same time, the magnetic remanence-thickness product (Mrt) is very important for readout amplitudes and DC noise. However, it remains a challenge to characterize these important media magnetic properties with good reliability and high throughput. A conventional rotating disc magnetometer, for example, cannot write HAMR media which has very high coercivity, while a high-field VSM (Vibrating Sample Magnetometer) has very low throughput and also causes destructive damage to the disk (i.e., cutting).

Embodiments are directed to a laser-heating assisted electromagnetic writer and reader apparatus and method, with which magnetic patterns (e.g., low frequency patterns) are written on, and read from, high coercivity media such as those used in HAMR. Embodiments of the disclosure provide for measuring Mrt, sigma Tc, and other magnetic properties of sample disks having a wide range of coercivity (e.g., ~5-100 kOe, such as between ~10 kOe and 50 kOe) with very high throughput, high reliability, and in a manner that is nondestructive to the sample disks. Some embodiments are directed to evaluating reversal (switching) probability as a function of laser power in the presence of a uniform external field. This measurement can be used to extract important magnetic properties of the subject disk, such as Tc distribution. Other embodiments provide for a quick measure of laser power requirements without having to go through time consuming spin-stand testing.

Various embodiments are directed to a HARDM that utilizes a specially designed heat-assisted writer to record low density waveforms on high coercivity recording media. This enables, for example, the readout of $M_rt$ values by sensing the magnetic waveforms written to the media. According to some embodiments, a HARDM apparatus includes a laser heating assisted writer, a rotating disk motion platform, a reader (e.g., an inductive reader), and a Kerr sensor. In some embodiments, the Kerr sensor is excluded from the HARDM apparatus or is an optional component. In other embodiments, the reader is excluded from the HARDM apparatus or is an optional component. The HARDM apparatus can be automated and implemented to include a graphical user interface.

Figure 3:
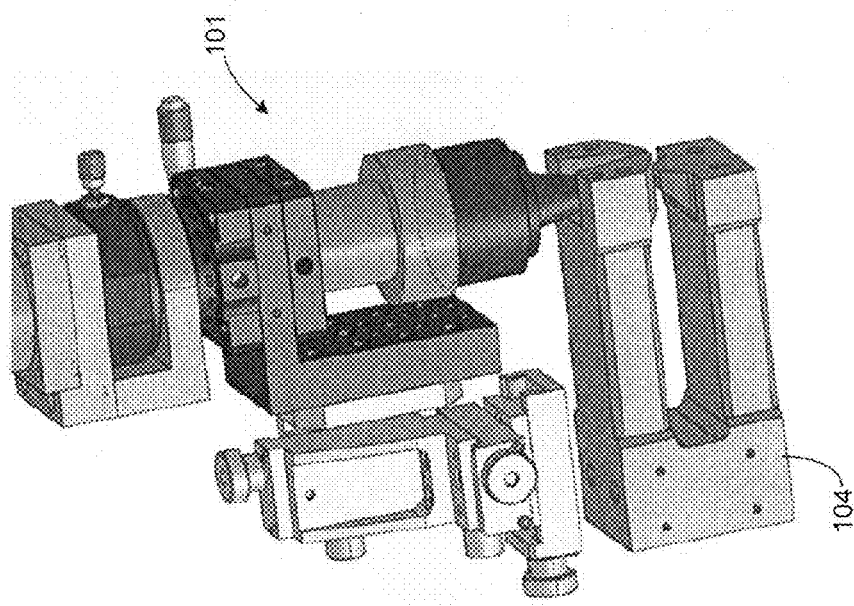
FIG. 3 is a perspective view of a heat-assisted writer of a HARDM apparatus in accordance with embodiments of the disclosure.
Figure 2:
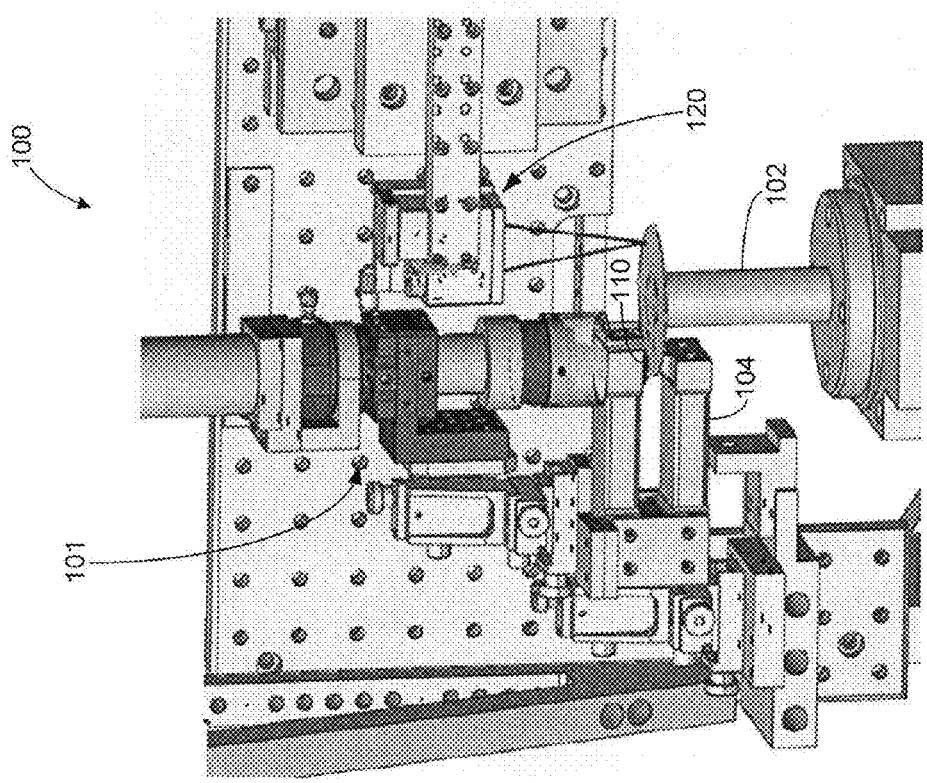
FIG. 2 is a perspective view of a HARDM apparatus in accordance with embodiments of the disclosure.

With reference to FIG. 1, a HARDM apparatus 100 is illustrated in accordance with an embodiment of the disclosure. FIG. 2 is a perspective view of an experimental setup of a HARDM apparatus 100 according to various embodiments. FIG. 3 is a perspective close-up view of heat-assisted writing components of the HARDM apparatus 100. The HARDM apparatus 100 includes a spindle 102 configured to rotate a magnetic recording medium 107 relative to a heat-assisted writer 101, an inductive reader 110, and a Kerr sensor 120 (which may be an optional component according to some embodiments). The heat-assisted writer 101 includes a writer 104 and a magnetic field generator 105, such as an electromagnet. The magnetic field generator 105 can be implemented to generate a magnetic field of up to about 1.5 Tesla perpendicular to the surface of the medium 107. The magnetic field generator 105 may be built into the writer 104 or be attached or placed in proximity to the writer 104. The magnetic field generator 105 is configured to expose a portion 109 (e.g., a track) of the medium 107 to a DC magnetic field, such as during an erase mode and a writing mode.

The heat-assisted writer 101 includes a laser arrangement 103 configured to heat the medium portion 109 (e.g., track) rotating through the writer 104. The laser arrangement 103 includes a heating laser 106 optically coupled to beam shaping optics 108, which serve to focus a light beam exiting an output 111 of the laser arrangement 103 onto the medium portion 109. Adjustable laser beam shaping optics 108 are incorporated into the laser arrangement 103 for achieving a tight focus on the media surface. With a high power laser source (e.g., several Watts), media can be heated to and above its Curie Temperature. High coercivity media, such as those used in HAMR, have a much lower coercivity at elevated temperature, allowing easy switching under a moderate external magnetic field (e.g., <1.5 Tesla). By adjusting laser power and/or laser pulse width and/or duty cycle, temperature of the media can be controlled.

During an erase mode, the magnetic field generator 105 is configured to generate a DC magnetic field that saturates the medium portion 109 while the laser arrangement 103 heats the medium portion 109. This serves to orient the magnetic grains of the medium portion 109 in a specified direction (e.g., down). During a writing mode, the magnetic field generator 105 is configured to reverse the DC magnetic field impinging the medium portion 109 while the laser arrangement 103 heats the medium portion 109. This serves to orient the magnetic grains of heated regions of the medium portion 109 in the opposite direction (e.g., up), thereby writing a magnetic pattern to the medium portion 109.

The HARDM apparatus 100 further includes a reader 110 configured to read the magnetic pattern written to the medium portion 109. The reader 110 is shown positioned proximate the spindle 102, but can be located elsewhere. The reader 110 generates a read signal in response to reading the magnetic pattern written to the medium portion 109. In some embodiments, the reader 110 is implemented as an inductive reader. In other embodiments, the reader 110 can be implemented using other read transducer technologies (e.g., a magnetoresistive reader). An inductive reader 110 can be employed in the HARDM apparatus 100 to provide a more accurate readout of the total magnetic moment of the medium portion 109 as compared to that provided by the Kerr sensor 120, as is further discussed hereinbelow. A processor 140 is coupled to the reader 110 and configured to measure one or more magnetic properties of the medium portion using the read signal. The processor 140 can be coupled to a display 150 (or graphical user interface) with which various measurements and data can be presented and generated. The read signal and/or data developed from the read signal can be output to another device or system.

In some embodiments, the HARDM apparatus 100 includes a Kerr sensor 120, in addition to or exclusive of the inductive reader 110. The Kerr sensor 120 includes a probe laser 122 (which produces incident beam 123 at a power of a few milliwatts), linear polarizer 124, beam splitter 126, polarizing prism (e.g., Wollaston prism) 127, photodiodes 128A and 128B, and differential amplifier 130. In some implementations, the differential amplifier 130 can be coupled to a lock-in amplifier (not shown). The lock-in amplifier, using the output signal 132 from the differential amplifier 130, can be configured to determine the real and imaginary components of the signal 132 and generate an output signal representative of same. During testing, incident beam 123 produced by the laser 122 passes through the polarizer 124 and beam splitter 126. Incident beam 123 is reflected at the surface of the disk 107 and undergoes a polarization alteration due to the magnetization of the disk 107. A reflected beam 125 is reflected by the beam splitter 126 to a detection arm which includes the Wollaston prism 127 and photodiodes 128A and 128B.

The Wollaston prism 127, or other analyzer, is used to separate polarized beam components 129A and 129B of the reflected beam 125. Photodiodes 128A and 128B provide positive and negative input signals to differential amplifier 130. The output of differential amplifier 130 is a signal 132 representing a difference in intensity of components 129A and 129B of the reflected beam 125, which is proportional to the change of magnetization at the magnetic pattern region of the disk 107. If included, the lock-in amplifier, using the output signal 132 from differential amplifier 130, is configured to determine the real and imaginary components of the signal 132 and generate an output signal representing same.

After writing a magnetic pattern (e.g., a low frequency square wave pattern) using the laser-heating assisted writer, a Kerr sensor can be used to read out the magnetic signal. Using the Kerr signal 132, the processor 140 can produce various data about the magnetic properties of the portion of the medium 109 written with the magnetic pattern. Such magnetic properties include once-around variation and remanent magnetization, for example.

Figure 4:
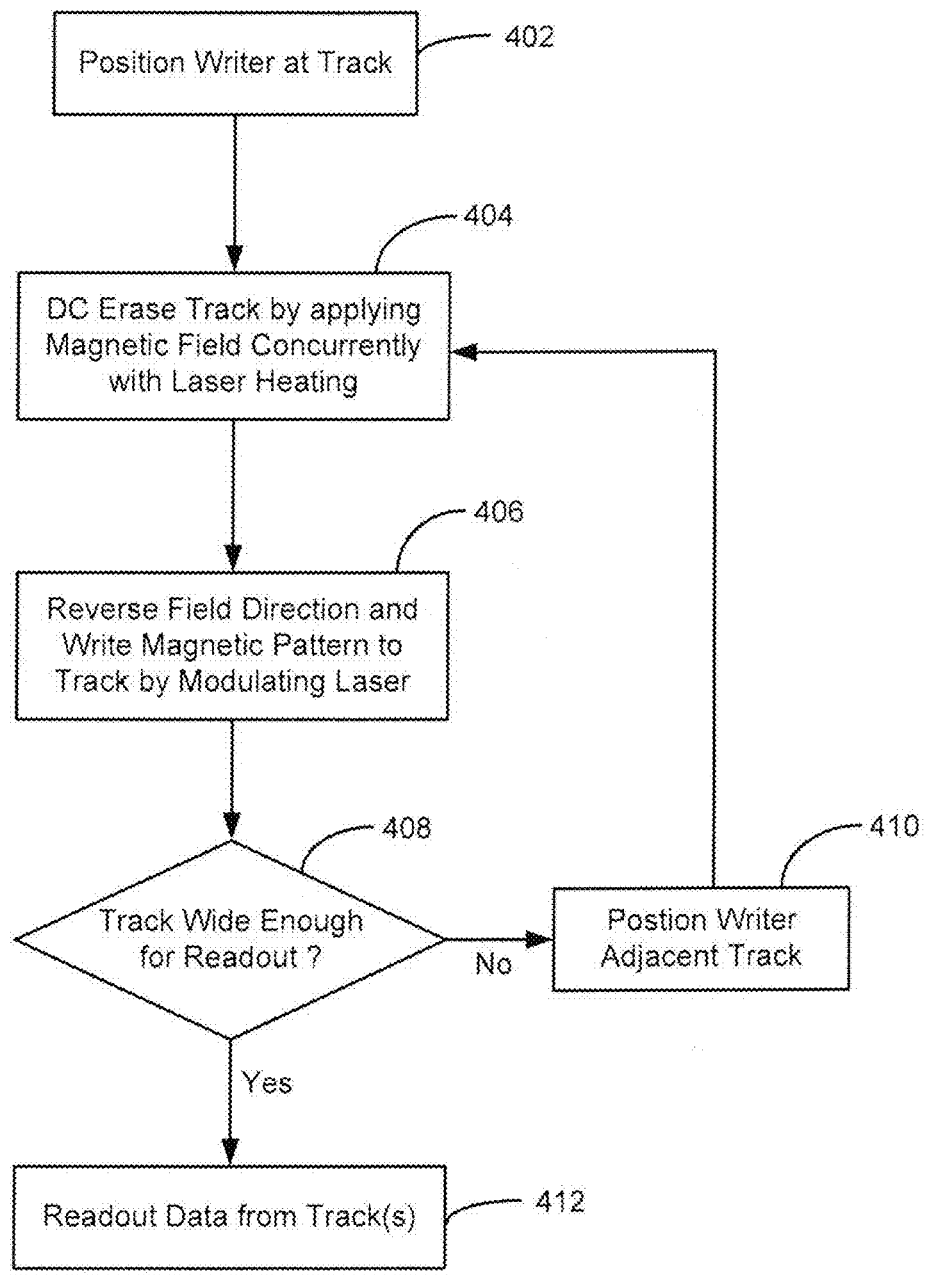
FIG. 4 illustrates various processes of a method for determining one or more magnetic properties of a magnetic recording disk subject to testing by a HARDM apparatus according to the embodiments shown in FIGS. 1-3.

FIG. 4 illustrates various processes of a method for determining one or more magnetic properties of a magnetic recording disk subject to testing by a HARDM apparatus 100 according to the embodiments shown in FIGS. 1-3. Initially, a disk 107 is placed on the spindle 102 such that the disk 107 passes under the output 111 of the laser arrangement 103. As the disk 107 passes within the writer 104, the portion 109 passing under the output 111 of the laser arrangement 103 can concurrently be subject to a DC magnetic field produced by the magnetic field generator 105. A circumferential region of the disk 107 passing under the output 111 of the laser arrangement 103 defines a track 113 to be written by the heat-assisted writer 101 and read by one or both of the reader 110 and the Kerr sensor 120.

According to the method illustrated in FIG. 4, the output 111 of the heat-assisted writer 101 is positioned 402 relative to the track 113, such as the center of the track 113. In some embodiments, the heat-assisted writer 101 can be configured for movement relative to a stationary spindle 102. In other embodiments, the heat-assisted writer 101 can be stationary, and the spindle 102 can be configured for movement relative to the stationary writer 101. In further embodiments, both the writer 101 and the spindle 102 can be configured for movement. It is noted that movement of one or both of the writer 101 and the spindle 102 can be implemented to be fully automatic (e.g., computer and motor control), fully manual (e.g., operator control), or partially automatic/partially manual. It is also noted that disk 107 is typically a blank disk devoid of pre-written servo tracks, and that encoders on the motion stages of the apparatus 100 can be used to locate tracks on the disk 107 as they are written.

With the writer output 111 properly positioned relative to the disk 107, the track 113 is subject to DC erasure 404. DC erasure 404 of the track 113 involves concurrently subjecting the track 113 to heat (e.g., between about room temperature and about 1000° C.) and a DC magnetic field (e.g., <1.5 T) sufficient to saturate the track 113, such that the magnetic grains of the track 113 are oriented in a down direction. DC erasure 404 can be performed in other ways, such as by the application of a high magnetic field (e.g., >6 T) without the need to heat the disk 107. The erasure process requires a full disk revolution to complete, which can take about 0.25 seconds, for example. After completing the erasure process, the HARDM apparatus 100 can be transitioned from the erasure mode of operation to a write mode.

Writing to the track 113 using the HARDM apparatus 100 involves reversing 406 the DC magnetic field to the direction (e.g., up) opposite that used during the DC erasure process. While subjecting track 113 to the opposite DC magnetic field, the laser arrangement 103 is modulated on and off at a desired frequency to write a magnetic pattern to the track 113. The magnetic pattern written to the track 113 can be a low frequency square wave, such as one between about 1 and 100 flux changes per inch (fci), for example. The region of the track 113 passing through the writer 104 during laser-on periods will be magnetized up, while the region of the track 113 passing through the writer 104 during laser-off periods will remain magnetized down. This results in the successful writing of a single track 113. The track width can be adjusted by adjusting the optical focus, and the pattern frequency can be adjusted by adjusting the laser modulation frequency. The writing process requires a full disk revolution to complete, which can take about 0.25 seconds, for example. As such, the erasing and writing processes for a single track 113 can take about 0.5 seconds.

Depending on the magnetic properties being evaluated and the type of sensing used to read the magnetic pattern written to the track 113, a single track 113 may be sufficient or multiple tracks 113 may be needed for the particular evaluation. A check 408 is made to determine if the track 113 written to the disk 107 is wide enough for readout by the particular sensor being used for a particular evaluation. For example, if the Kerr sensor 120 is to be used for a specified magnetic property evaluation, a single track 113 (i.e., the width of a single track) containing the magnetic pattern may be sufficient. If an inductive reader 110 is to be used, several tracks may be needed to provide sufficient readout for the reader 110. If the existing track or tracks 113 are not sufficiently wide, the writer output 111 can be positioned 410 to a track adjacent the one or ones that have been previously written The erasing and writing processes 404 and 406 can be repeated for the adjacent track or tracks. After completion of the writing process, and after a track(s) of sufficient width has been written to the disk 107, one or both of the reader 110 and Kerr sensor 120 can read 412 the magnetic pattern written to the track(s). A processor 140 may then operate on the signal produced by one or both of the reader 110 and Kerr sensor 120 to determine one or more magnetic properties of the disk 107.

According to some embodiments, the processes illustrated in FIG. 4 can be implemented in a method for determining the value of $M_r t$ for a magnetic recording disk subject to testing by a HARDM apparatus 100. For $M_r t$ reading using an inductive reader 110, for example, usually multiple neighboring tracks 113 need to be written to form a track wide enough to provide a signal useful for the reader 110 (e.g., a signal wide enough to provide a good signal-to-noise ratio). According to some embodiments, a number of tracks 113 can be "stitched" together to form a single or composite track having a width that can be readily detected by the reader 110.

Figure 6:
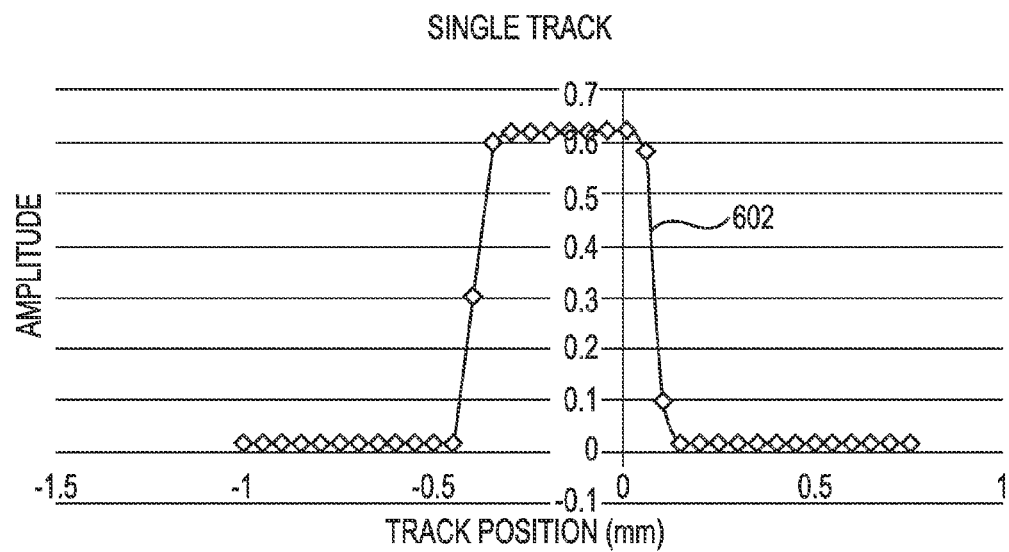
FIG. 6 shows a magnetic pattern written to a single track of a magnetic recording disk subject to testing by a HARDM apparatus in accordance with various embodiments.
Figure 7:
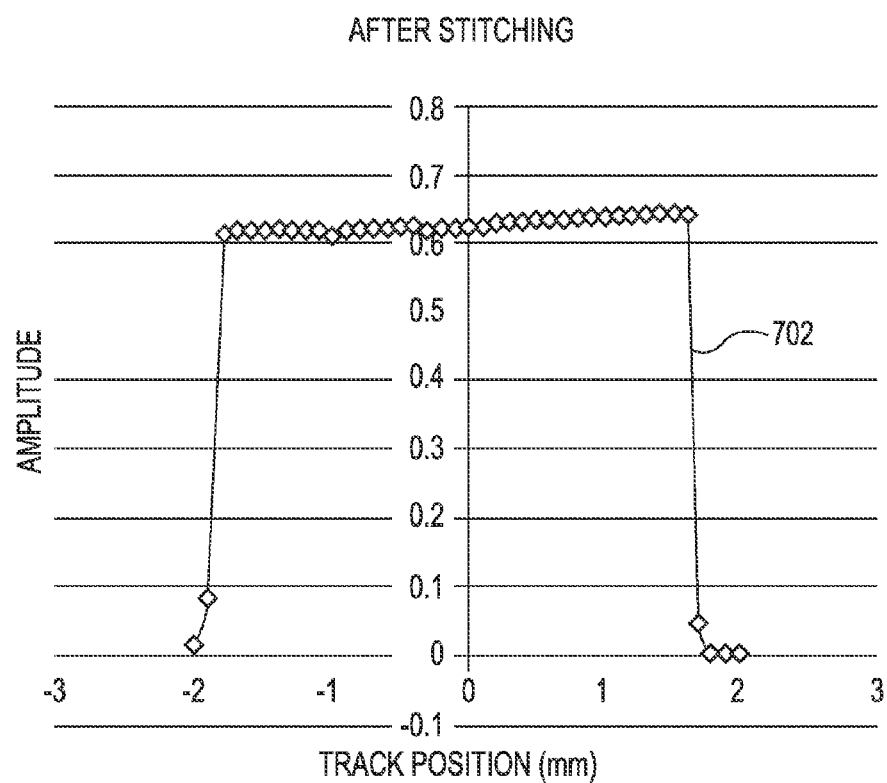
FIG. 7 shows a magnetic pattern that spans several tracks, and is formed by stitching together several neighboring tracks in accordance with various embodiments.

FIG. 6 shows a magnetic pattern 602 written to a single track which, in this illustrative example, has a track width of about 0.4 mm. FIG. 7 shows a magnetic pattern 702 that spans several tracks, and is formed by stitching together several neighboring tracks. In the illustrative example shown in FIG. 7, several tracks are stitched together for form a wide track having a width of about 3.5 mm. By way of example, 10 narrow tracks can be being stitched together to form a relatively wide >3 mm track, taking about 5 seconds to create (2.5 seconds of erasure time and 2.5 seconds of writing time). After stitching tracks, the disk 107 can be spun to a speed for inductive readback. For example, the disk 107 can be rotated at a speed of between about 5 and 500 RPM during the erasure/writing phases, and then increased to between about 1,000 and 10,000 RPM during the readback phase.

Figure 8:
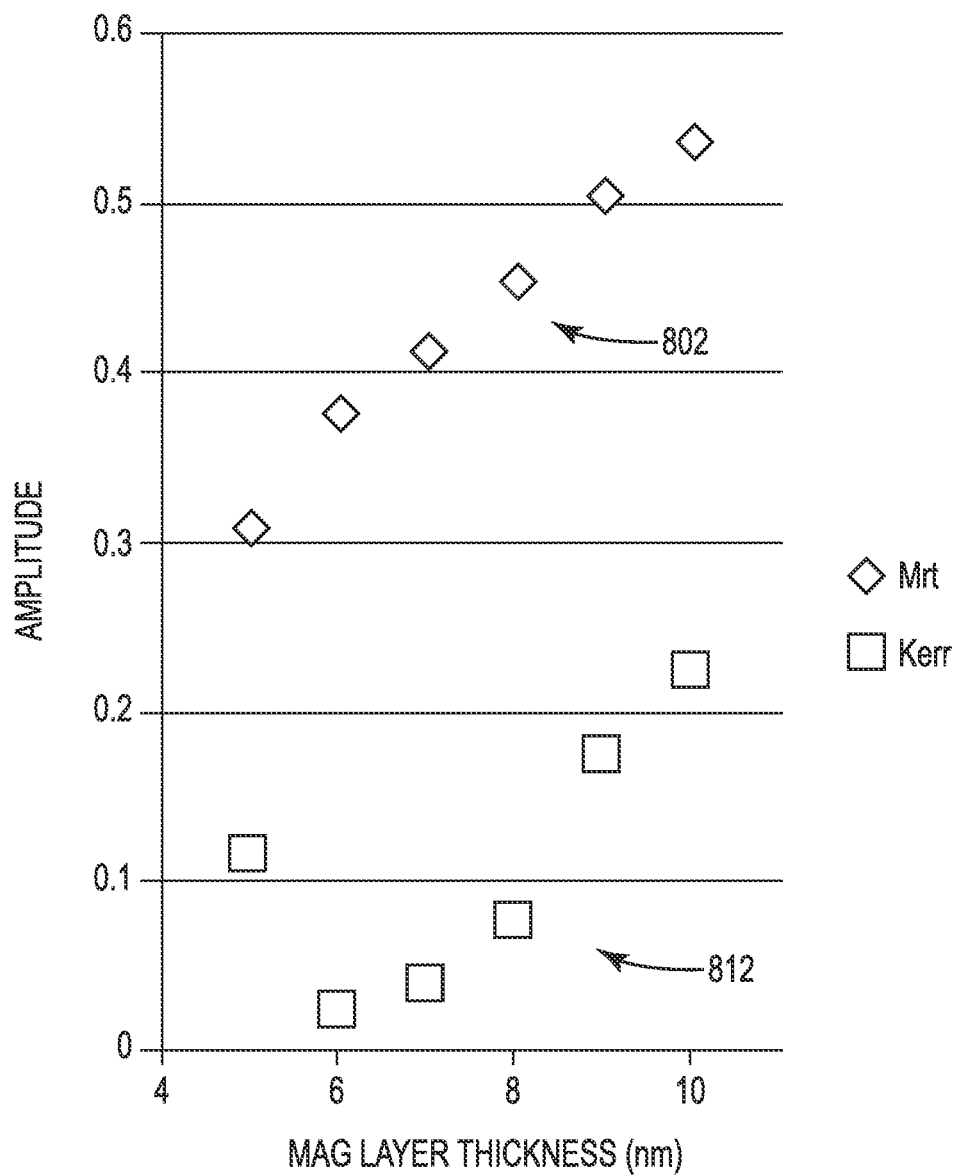
FIG. 8 shows data plots representing values of Mrt obtained from reading a stitched track containing a magnetic pattern respectively using an inductive reader and a Kerr sensor according to various embodiments.

Example $M_r t$ data is shown in FIG. 8. FIG. 8 shows $M_r t$ evaluation results on a group of samples with increasing magnetic layer thickness. The data plot 802 represents values of $M_r t$ obtained from reading a stitched track containing a magnetic pattern using an inductive reader 110. The data plot 812 represents values of $M_r t$ obtained from reading a stitched track containing a magnetic pattern using a Kerr sensor 120. It can be readily seen that $M_r t$ readback using an inductive reader 110 is much more reliable in determining the total magnetic moment than when using a Kerr sensor 120. For example, it can be seen that the $M_r t$ values for the data plot 802 are linearly proportional to magnetic layer thickness, unlike the Kerr signal data plot 812. This is because the Kerr sensor 120 relies on optical properties of the media, which can be changed by layer structure, material used, wavelength dependence, and many other factors.

Figure 5:
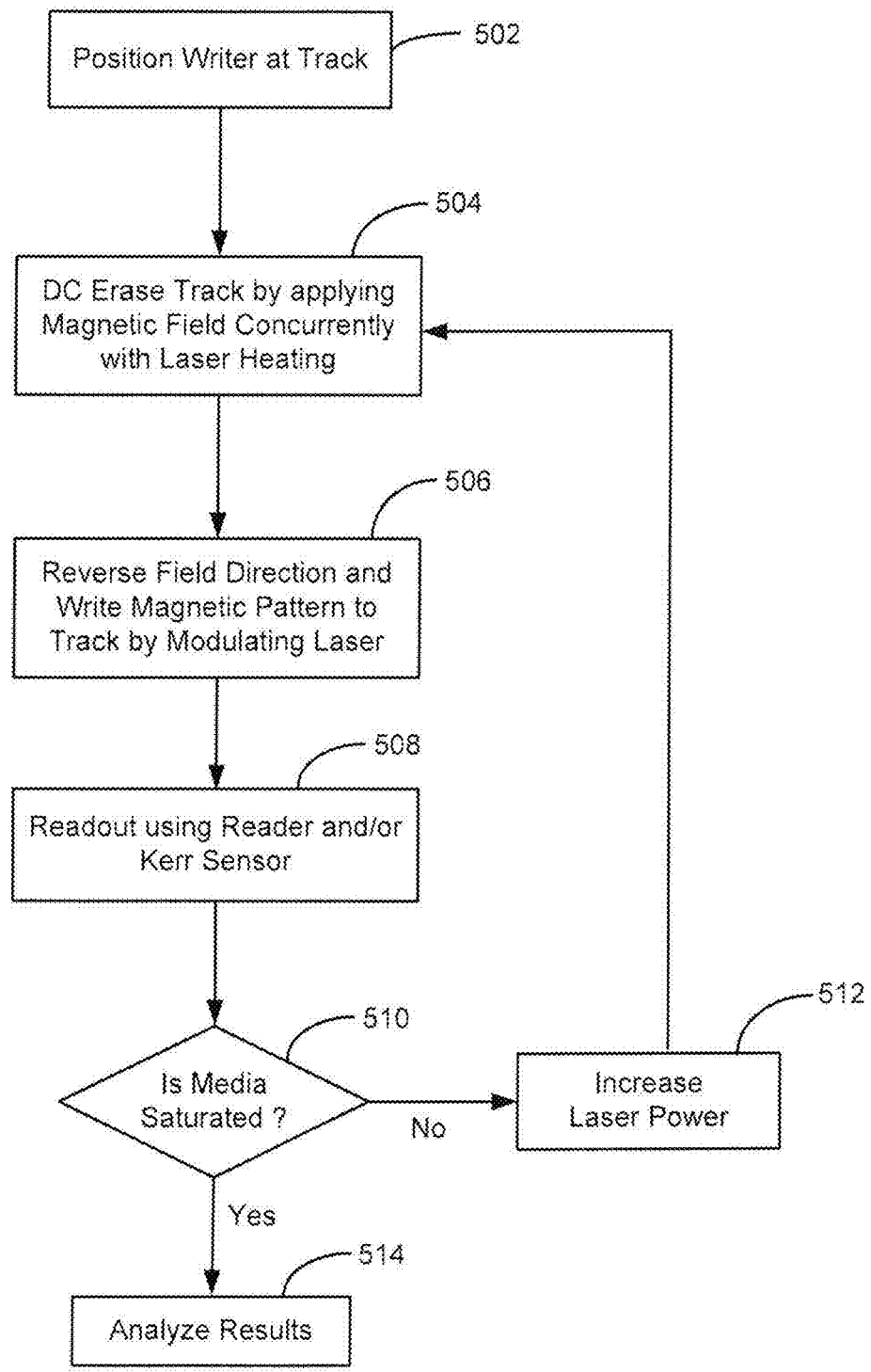
FIG. 5 illustrates various processes for measuring reversal (switching) probability as a function of laser power using a HARDM apparatus in accordance with embodiments of the disclosure.

FIG. 5 illustrates various processes for measuring reversal (switching) probability as a function of laser power using a HARDM apparatus 100 in accordance with embodiments of the disclosure. According to various embodiments, with a constant magnetic field applied, laser power is incremented to achieve higher and higher temperature at the media. Remanent magnetization is recorded after each increment in laser power. The recorded remanent magnetization as a function of laser power can be used to extract and analyze Curie Temperature distribution of the media.

According to the method illustrated in FIG. 5, the output 111 of the heat-assisted writer 101 is positioned 502 relative to the track 113, such as the center of the track 113. Initially, the power of the laser arrangement 103 is set to a low level, such as a level below that required to change the orientation of the magnetic grains of the track 113. With the writer output 111 properly positioned relative to the disk 107, the track 113 is subject to DC erasure 504, in which both heat and a uniform DC magnetic field are applied to the track 113. While subjecting track 113 to a DC magnetic field opposite that used during the erasure process, the laser arrangement 103 is modulated on and off at a desired frequency to write 506 a magnetic pattern (e.g., a low frequency square wave) to the track 113.

The method of FIG. 5 further involves performing a readout 508 using the inductive reader 110 or the Kerr sensor 120. The readout data can be used to generate data such as that shown in FIG. 9 (i.e., reversal probability vs. laser power). A check 510 is made to determine if the track 113 is saturated. If not, the power of the laser arrangement 103 is increased slightly (e.g., by about 1%). The processes of blocks 504, 506, 508, and 510 are repeated until it is determined that the track 113 is saturated. When no further change is observed in the remanent magnetization upon increasing laser power, the track 113 is considered saturated. The readout data is then analyzed 514. For example, remanent magnetization is measured and recorded after writing with each increment in laser power, and this data is readout and analyzed.

Figure 9:
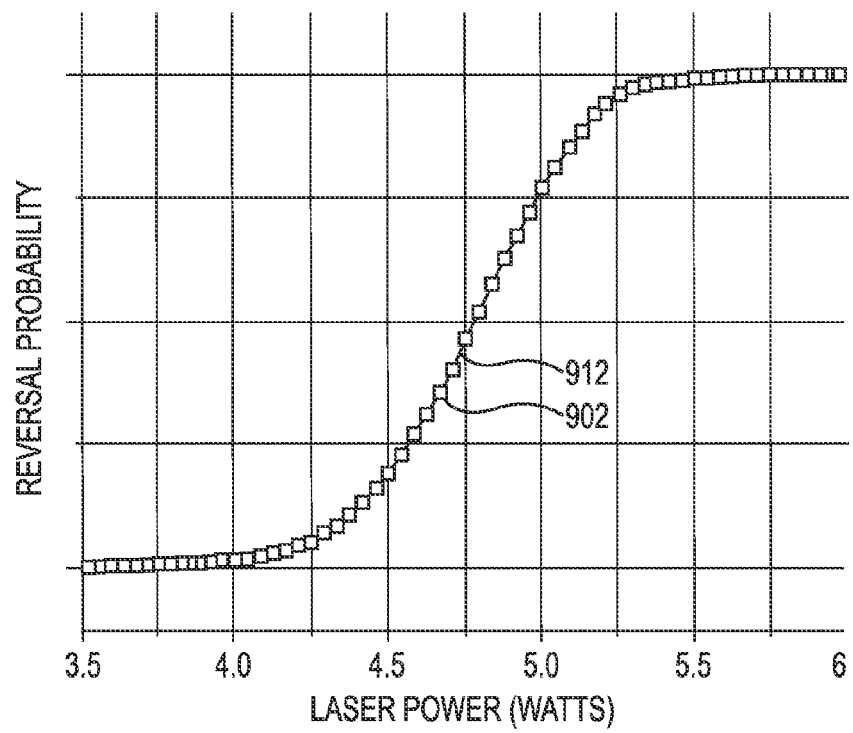
FIG. 9 is a graph showing reversal probability as a function of laser power developed from data acquired by a HARDM apparatus in accordance with various embodiments.

FIG. 9 is a graph showing reversal probability as a function of laser power. The data of FIG. 9 represents analysis results produced at block 514 of FIG. 5. The reversal probability versus laser power curve of FIG. 9 can be fitted with a non-linear function such as a bi-error function. FIG. 9 shows such a fitting to the experimental result, with excellent accuracy. The black squares 902 are experimental data, and the solid line 912 is a nonlinear fit using bi-error functions. The derived fitting parameters provide important information such as sigma Tc and laser power requirement. For example, to quantify the sharpness of the reversal probability curve such as that shown in FIG. 9, nonlinear fitting based on error functions can be used to fit the experimental curve. From the fitting parameters, one can extract the standard deviation and peak position. These fitted parameters can then be used to derive important metrics such as sigma Tc and laser power requirement.

Figure 10:
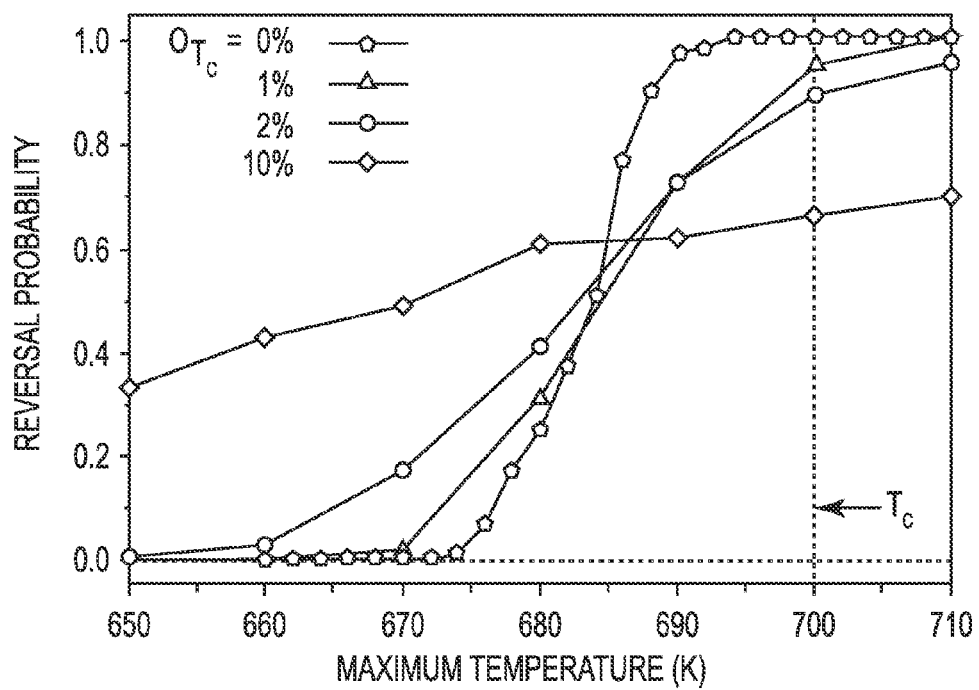
FIG. 10 shows a modeling result on the effect of Curie Temperature distribution developed from data derived from fitting parameters for the curve shown in FIG. 9.

FIG. 10 shows a modeling result on the effect of sigma Tc. As is clearly illustrated, a larger sigma Tc results in a much shallower reversal probability slope. Therefore, the steeper the curve is, the narrower the distributions are. For example, assuming the media's temperature rise from ambient, $T_{amb}$, is linearly proportional to the heating laser power P:

$$T - T_{amb} = \alpha P$$

From the above, the following relationship between $$\frac{\sigma T c}{T c}$$

and $$\frac{\sigma P}{P 50}$$

can be obtained:

$$\frac{\sigma T_c}{T_c} = \frac{\alpha \times \sigma P}{T_{amb} + \alpha \times P_{50}}$$

Where $P_{50}$ is the laser power required to achieve 50% reversal probability. Assuming $P_{50}$ corresponds to Tc, the following can be obtained:

$$T_c - T_{amb} = \alpha P_{50}$$

Combining this equation with the equation above, the following is obtained:

$$\frac{\sigma T_c}{T_c} = \left(1 - \frac{T_{amb}}{T_c}\right) \frac{\sigma P}{P_{50}}$$

Using 300 K for $T_{amb}$ and 700 K for $T_c$, the following is obtained:

$$\frac{\sigma T_c}{T_c} \approx 0.57 \times \frac{\sigma P}{P_{50}}$$

With this last equation, sigma Tc can be easily derived from the measured sigma laser power and P50 laser power, both of which can be obtained by fitting the reversal probability curve of FIG. 9.

Figure 11:
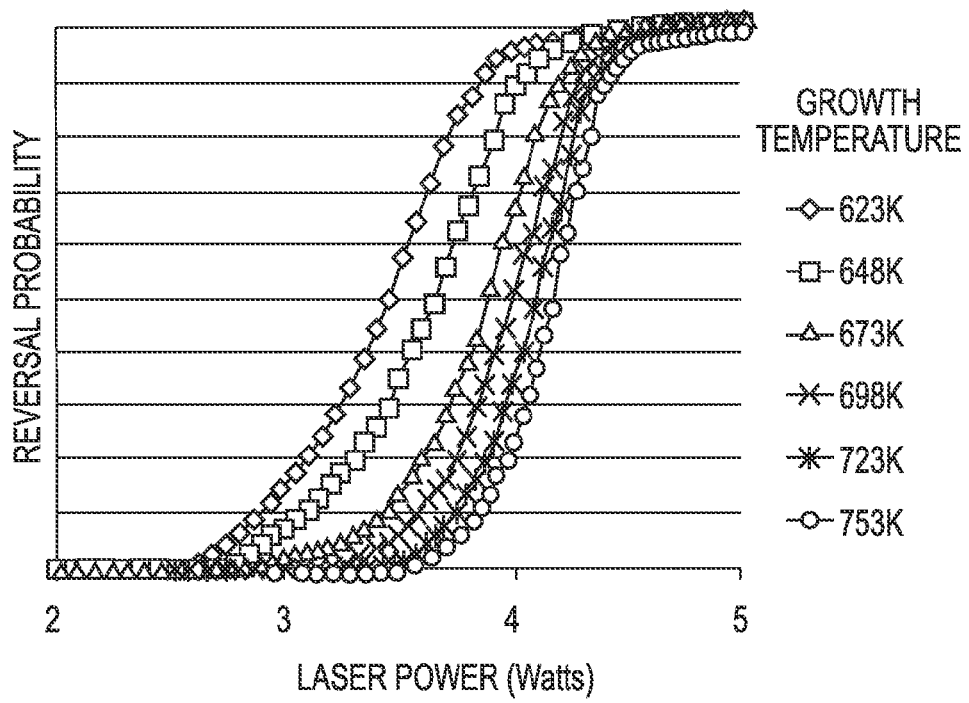
FIG. 11 shows data plots of reversal probability as a function of laser power for a ladder of heat-assisted magnetic recording (HAMR) media deposited at different temperature in accordance with various embodiments.
Figure 12:
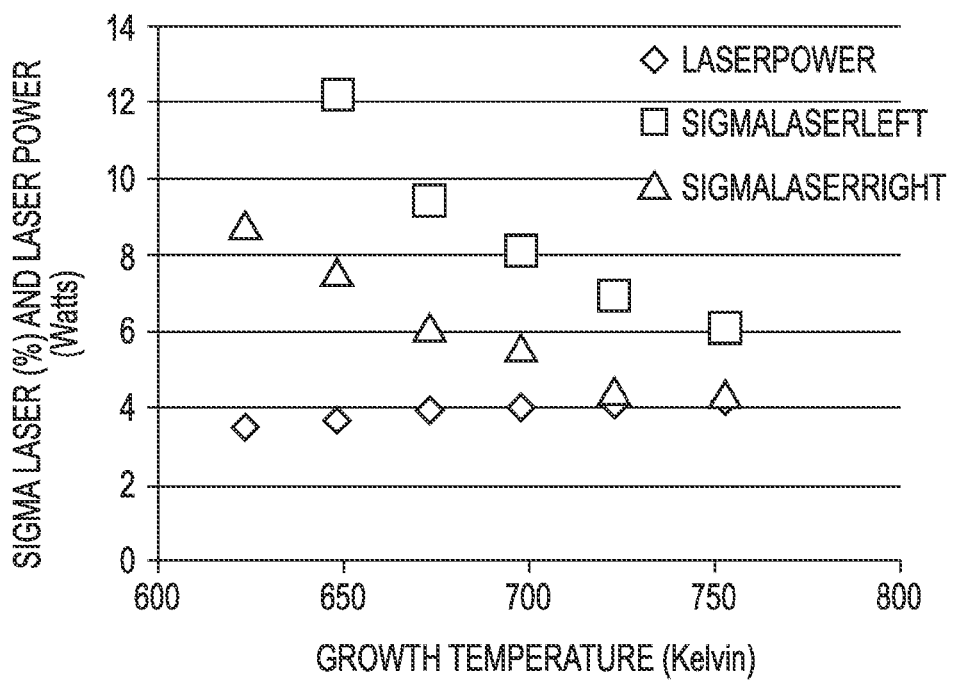
FIG. 12 illustrates extracted laser power requirement data showing higher power needed for HAMR media samples grown at higher temperature, and the extracted distributions for such a ladder of HAMR media in accordance with various embodiments.

FIGS. 11 and 12 show the analysis results on a group of samples with varying deposition temperature. FIG. 11 shows data plots of reversal probability as a function of laser power for a ladder of HAMR media deposited at different temperature. FIG. 12 illustrates extracted laser power requirement data showing higher power needed for HAMR media samples grown at higher temperature, and the extracted distributions for such a ladder of HAMR media. It can be seen in FIG. 12 that distributions narrow down as growth temperature is increased. The data of FIGS. 11 and 12 demonstrates that higher deposition temperature facilitates better growth and film quality, which then results in smaller distributions. The measurement results shown in FIGS. 11 and 12 clearly reflect this trend, demonstrating the accuracy and reliability of both the disclosed measurement method and apparatus. For a more in-depth analysis, as is reflected in FIG. 12, a bi-error function can be used instead of a single error function. The two halves of the reversal probability curve can be fitted differently, deriving two standard deviation values, sigma Laser left, and sigma Laser right. While the left side standard deviation can be affected by distributions in the media's anisotropy and grain size, the right side standard deviation is more closely related to the media's Tc distribution.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. An apparatus, comprising:
   a spindle configured to rotate a magnetic recording medium;
   a magnetic field generator configured to expose a track of the medium to a DC magnetic field, the generator configured to saturate the track during an erase mode and reverse the DC magnetic field impinging the track during a writing mode;
   a laser arrangement configured to heat the track during the erase mode and, during the writing mode, heat the track while the track is exposed to the reversed DC magnetic field so as to write a magnetic pattern thereon;
   a reader configured to read the magnetic pattern and generate a read signal; and
   a processor coupled to the reader and configured to measure one or more magnetic properties of the track using the read signal.

2. The apparatus of claim 1, wherein the reader comprises an inductive reader.

3. The apparatus of claim 1, wherein the one or more magnetic properties comprises magnetic remanence-thickness product ($M_r t$).

4. The apparatus of claim 1, wherein the one or more magnetic properties comprises total magnetic moment.

5. The apparatus of claim 1, wherein the one or more magnetic properties comprises a reversal probability as a function of power applied to the laser arrangement.

6. The apparatus of claim 5, wherein the processor is configured to determine a Curie Temperature ($T_c$) distribution of the track using the reversal probability as a function of applied laser arrangement power.

7. The apparatus of claim 5, wherein the processor is configured to determine a laser power required to achieve a specified reversal probability.

8. The apparatus of claim 1, wherein the magnetic pattern spans a plurality of stitched-together tracks.

9. The apparatus of claim 1, further comprising a Kerr sensor configured to generate a Kerr signal using the magnetic pattern.

10. The apparatus of claim 9, wherein the processor is configured to measure one or more magnetic properties of the track using the Kerr signal.

11. The apparatus of claim 1, wherein the magnetic recording medium has a coercivity of between about 5 kOe and 100 kOe.

12. A method, comprising:
    rotating a magnetic recording medium proximate a magnetic field generator, a laser arrangement, and a reader;
    DC erasing a track of the medium by concurrently exposing the track to a first DC magnetic field and heating the track with the laser arrangement;
    writing a magnetic pattern on the track by concurrently heating the track using the laser arrangement and exposing the track to a second DC magnetic field opposite the first DC magnetic field;
    reading the magnetic pattern and generating a read signal; and
    measuring one or more magnetic properties of the track using the read signal.

13. The method of claim 12, wherein the one or more magnetic properties comprises magnetic remanence-thickness product ($M_r t$).

14. The method of claim 12, wherein the one or more magnetic properties comprises total magnetic moment.

15. The method of claim 12, wherein the one or more magnetic properties comprises a reversal probability as a function of power applied to the laser arrangement.

16. The method of claim 15, further comprising:
    computing a curve of reversal probability as a function of applied laser arrangement power;
    deriving fitting parameters for the curve; and
    determining a Curie Temperature ($T_c$) distribution of the track using the fitting parameters.

17. The method of claim 15, further comprising:
    computing a curve of reversal probability as a function of applied laser arrangement power;
    deriving fitting parameters for the curve; and
    determining a laser power required to achieve a specified reversal probability using the fitting parameters.

18. The method of claim 12, wherein writing the magnetic pattern comprises:
    writing the magnetic pattern to a plurality of tracks;
    stitching together the plurality of tracks to produce a stitched track; and
    reading the stitched track to generate the read signal.

19. The method of claim 12, further comprising:
    rotating the magnetic recording medium proximate a Kerr sensor;
    generating a Kerr signal using the magnetic pattern; and
    measuring one or more magnetic properties of the track using the Kerr signal.

20. The method of claim 12, wherein the magnetic recording medium has a coercivity of between about 5 kOe and 100 kOe.

21. An apparatus, comprising:
    an arrangement configured to rotate a magnetic recording medium configured for heat-assisted magnetic recording;
    means for DC erasing a track of the medium using a first DC magnetic field;
    means for writing a magnetic pattern on the track by concurrently heating the track and exposing the track to a second DC magnetic field opposite the first DC magnetic field;
    a reader configured to read the magnetic pattern and generate a read signal; and
    means for measuring one or more magnetic properties of the track using the read signal.

22. The apparatus of claim 21, wherein the one or more magnetic properties comprises one or more of magnetic remanence-thickness product ($M_r t$), total magnetic moment, and a reversal probability as a function of power applied to a laser arrangement used to heat the track.

* * * * *